United States Patent
Chuang et al.

(10) Patent No.: US 7,274,217 B2
(45) Date of Patent: Sep. 25, 2007

(54) HIGH PERFORMANCE PFET HEADER IN HYBRID ORIENTATION TECHNOLOGY FOR LEAKAGE REDUCTION IN DIGITAL CMOS VLSI DESIGNS

(75) Inventors: Ching-Te Kent Chuang, South Salem, NY (US); Koushik Kumar Das, Yorktown Heights, NY (US); Shih-Hsien Lo, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 264 days.

(21) Appl. No.: 11/100,883

(22) Filed: Apr. 7, 2005

(65) Prior Publication Data

US 2006/0226493 A1   Oct. 12, 2006

(51) Int. Cl.
*H01L 23/62* (2006.01)
*H03K 19/094* (2006.01)

(52) U.S. Cl. .......................... 326/83; 326/27; 327/544; 257/369; 438/199

(58) Field of Classification Search ................ 326/17, 326/27, 83; 327/544; 257/351, 347, 369; 438/149, 153, 199
See application file for complete search history.

(56) References Cited

U.S. PATENT DOCUMENTS 6,049,245 A * 4/2000 Son et al. .................... 327/544
6,310,487 B1 * 10/2001 Yokomizo ................... 324/769

* cited by examiner

*Primary Examiner*—Daniel Chang
(74) *Attorney, Agent, or Firm*—Scully, Scott, Murphy & Presser, P.C.; Rafael Perez-Pineiro, Esq.

(57) ABSTRACT

Discloses are CMOS circuit designs that combine MTC-MOS and hybrid orientation technology to achieve the dual objectives of high performance and low standby leakage power. The invention utilizes novel combinations of a thick-oxide high-VTH PFET header with various gate- and body-biased schemes in HOT technology to significantly reduce the performance penalty associated with conventional PFET headers. A first embodiment of the invention provides a HOT-B high-VTH thick oxide bulk PFET header scheme. This header scheme can be expanded by application of a positive gate bias VPOS (VPOS>VDD) to the HOT-B PFET header during standby mode and a negative gate bias VNEG (VNEG<GND) in active mode. Another embodiment provides a HOT-A high-VTH thick oxide SOI PFET header scheme. A further embodiment provides a HOT-A body biased high-VTH thick oxide SOI PFET header scheme.

25 Claims, 4 Drawing Sheets

US 7,274,217 B2

HIGH PERFORMANCE PFET HEADER IN HYBRID ORIENTATION TECHNOLOGY FOR LEAKAGE REDUCTION IN DIGITAL CMOS VLSI DESIGNS

This invention was made with Government support under Contract No.: NBCH30390004 awarded by DARPA. The Government has certain rights in this invention.

BACKGROUND OF THE INVENTION

1. Field of the Invention

This invention generally relates to very large scale integrated (VLSI) circuit designs. More specifically, the invention relates to leakage reduction in digital CMOS VLSI designs.

2. Background Art

Leakage power (both gate and sub-threshold) is predicted to be the limiting factor in the design of future VLSI systems. MTCMOS (or VDD-gating) is a very popular technique for controlling standby leakage. It adds a high-VTH PFET header or a high-VTH NFET footer device in series to a circuit to reduce leakage in standby mode. Various other incarnations of MTCMOS have been proposed. The main consideration in the implementation of the MTCMOS scheme is the trade-off between standby leakage power and active mode performance.

In general, a PFET device is slower than an NFET device because of the lower mobility of holes compared with electrons. So, a circuit with a high-VTH PFET header is slower than a circuit with a high-VTH NFET footer. However, the PFET header is more effective in reducing gate leakage when the circuit is in standby mode. Thick-oxide high-VTH NFET footer (BGMOS scheme) has been described to control both standby gate and sub-threshold leakages. For silicon-on insulator (SOI) technology, header/footer body biasing schemes have been proposed to boost active-mode MTCMOS performance. It has also been shown that a supplementary capacitor in parallel with the header/footer in MTCMOS circuits is effective for reducing virtual VDD/GND bounce caused by sudden and large current spikes.

It has also been shown that hole mobility is more than doubled on (110) silicon substrates compared with conventional substrates. To fully utilize this fact, a technology, referred to as Hybrid Orientation Technology (HOT), is being used to extend circuit performance. Two HOT structures are possible: HOT-A with PFET on (110) SOI and NFET on (100) silicon epitaxial layer, and HOT-B with NFET on (100) SOI and PFET on (110) silicon epitaxial layer.

SUMMARY OF THE INVENTION

An object of this invention is to provide a CMOS VLSI design that achieves both high performance and low standby leakage power.

Another object of the present invention is to combine MTCMOS and hybrid orientation technology to achieve high performance and low standby leakage power.

A further object of the invention is to provide a high performance PFET header in hybrid orientation technology for leakage reduction in digital CMOS VLSI design.

These and other objectives are attained by combining MTCMOS and hybrid orientation technology to achieve the dual objectives of high performance and low standby leakage power. The invention utilizes novel combinations of a thick-oxide high-VTH PFET header with various gate- and body-biased schemes in HOT technology to significantly reduce the performance penalty associated with conventional PFET headers.

A first embodiment of the invention provides a HOT-B high-VTH thick oxide bulk PFET header scheme. Usage of HOT-B boosts header performance; a junction capacitance of the bulk header reduces virtual-VDD bounce. This header scheme can be expanded by application of a positive gate bias VPOS (VPOS>VDD) to the HOT-B PFET header during standby mode and a negative gate bias VNEG (VNEG<GND) in active mode.

Another embodiment of the invention provides a HOT-A high-VTH thick oxide SOI PFET header scheme. HOT-A further reduces header PFET ON resistance as it is a SOI device.

A further embodiment provides a HOT-A body biased high-VTH thick oxide SOI PFET header scheme. Body-biasing helps in further improving PFET ON current during active mode.

The HOT-A high-VTH thick oxide SOI PFET header schemes can be combined. Additionally, these HOT-A high-VTH thick oxide SOI PFET header schemes, and their combination, can be expanded by application of a positive gate bias VPOS (VPOS>VDD) to the HOT-A PFET header during standby mode and a negative gate bias VNEG (VNEG<GND) in active mode.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
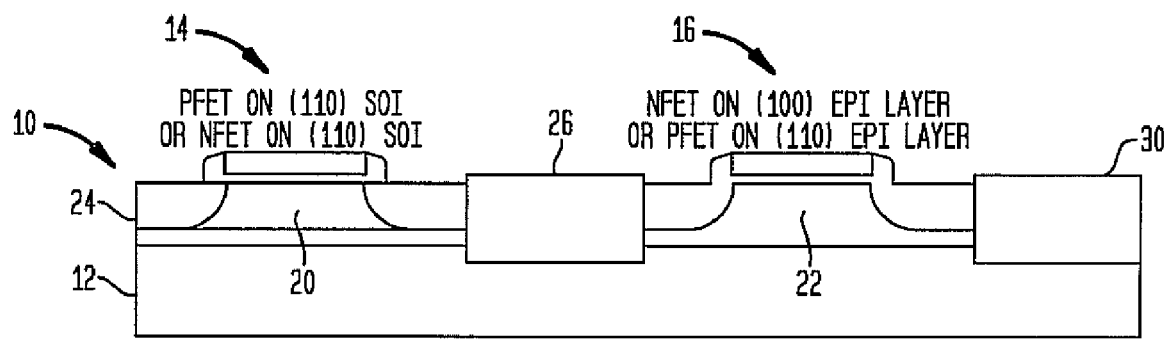
FIG. 1 is a schematic cross-section illustrating hybrid orientation technology.

FIG. 1 is a schematic cross-section illustrating hybrid orientation technology (HOT). More specifically, FIG. 1 shows a portion of a silicon wafer 10 comprising silicon substrate 12 and transistors 14 and 16. Each transistor includes source (S), drain (D) and gate (G) regions, with the source and drain regions separated by a channel region. The channel region of transistor 14 is referenced at 20, and the channel region of transistor 16 is referenced at 22. Beneath transistor 14 is a buried oxide (BOX) region 24, which separates the transistor from the silicon substrate 12. The channel region 22 between the source and drain of transistor 16 is not separated from the silicon substrate and instead is a direct extension of that substrate. A shallow-trench-isolation (STI) region 26 separates transistor 14 from transistor 16, and another STI region 30 is shown in FIG. 1, to the right of transistor 16.

One of the transistors 14 and 16 is a PFET and the other of these transistors is an NFET. When transistor 14 is a PFET and transistor 16 is an NFET, the structure is referred to as HOT-A; while when transistor 14 is an NFET and transistor 16 is a PFET, the structure is referred to as HOT-B.

Thus, when transistor 14 is a PFET it resides on (110) SOI; and when this transistor is an NFET, it resides on (100) SOI. When transistor 16 is an NFET, it resides on (100) epi-Layer; and when this transistor is a PFET, it resides on (110) epi-Layer.

Figure 2:
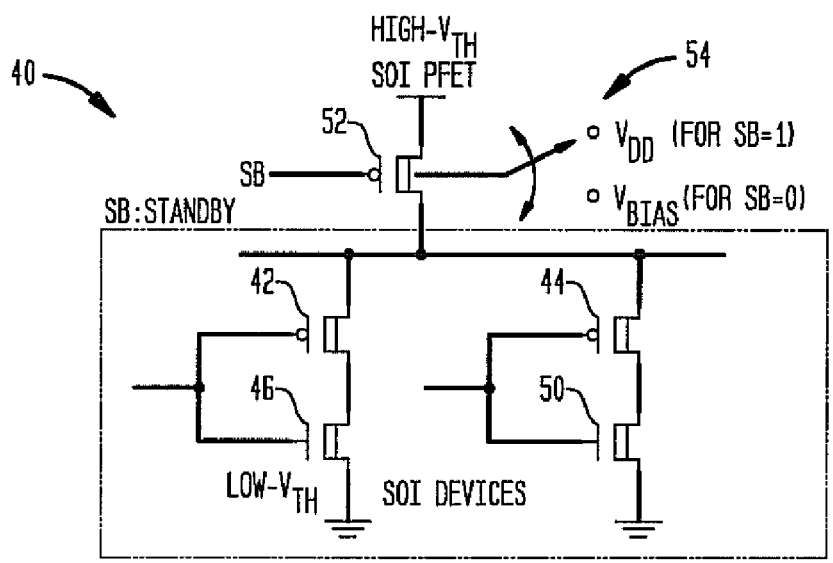
FIG. 2 shows a conventional silicon-on-insulator (SOI) body-biased MTCMOS scheme.

Also, as mentioned above, and with reference to FIG. 2, for SOI technology, header/footer body-biasing schemes have been proposed to boost active-mode MTCMOS performance. More specifically, FIG. 2 shows a circuit 40 comprising PFETs 42 and 44, NFETs 46 and 50, a header PFET 52, and biasing mechanism 54. PFET 42 and NFET 46 are low voltage threshold SOI devices, and PFET 52 is a high voltage threshold SOI PFET.

Figure 3:
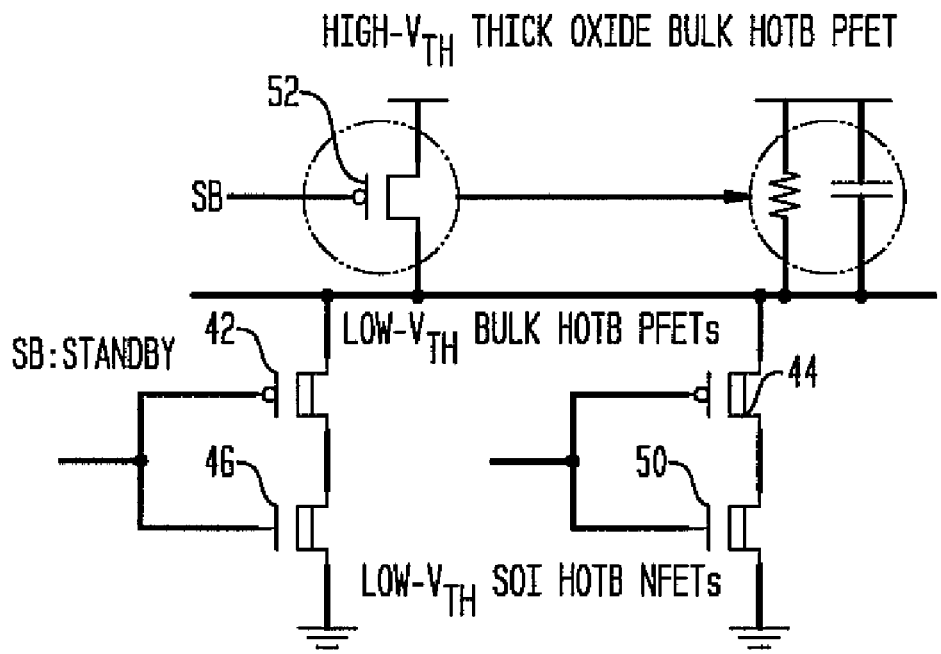
FIG. 3 shows a first embodiment of the invention, which comprises a HOT-B high-VTH thick oxide bulk PFET header.

FIG. 3 illustrates a first embodiment of the invention, where the logic PFETs 42 and 44 in the circuit (along with the high-VTH thick oxide PFET header 52) are in silicon epitaxial layer, and the logic NFETs 46 and 50 are in SOI. This bodes very well for the header performance compared with the basic MTCMOS scheme of FIG. 2. The header PFET 52 automatically comes with lot of "Bulk" junction capacitance, which makes it very effective for reducing virtual VDD bounce noise. Also, the usage of HOT technology significantly increases the ON current (ION) and reduces the ON resistance of the header PFET. Moreover, the usage of PFET header (as opposed to an NFET footer) with a thick-oxide is very effective in controlling standby-mode gate leakage. The standby sub-threshold leakage is suppressed because of the high-VTH of the header PFET.

Figure 4:
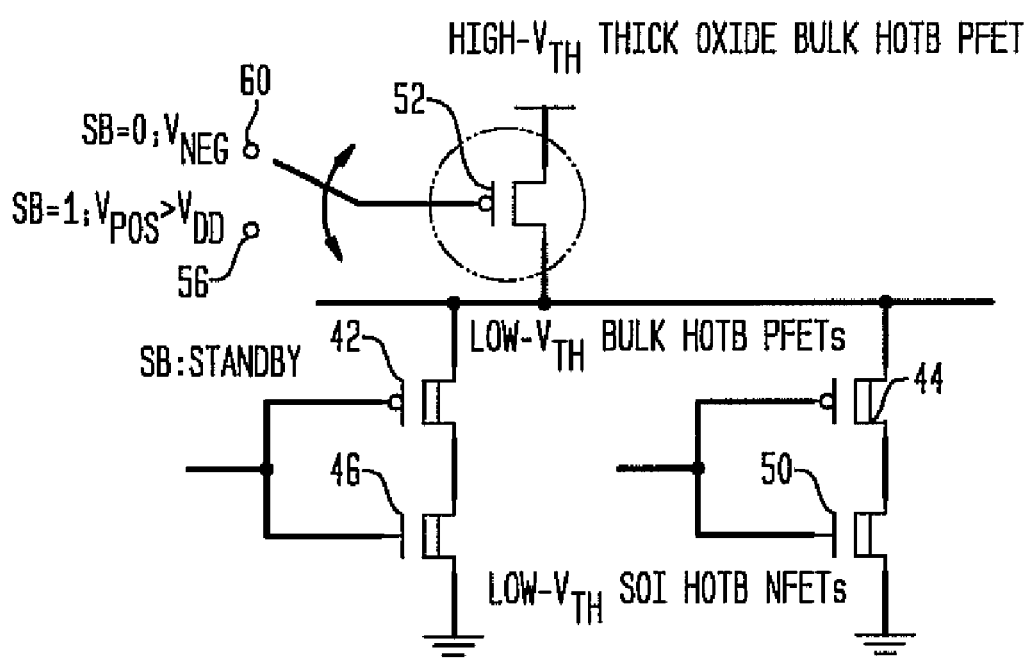
FIG. 4 illustrates a second embodiment of the invention, which comprises a HOT-B high-VTH thick oxide bulk PFET header.

In accordance with another embodiment of the invention, the scheme of FIG. 3 is expanded, as illustrated in FIG. 4, by applying a positive gate bias VPOS 56 (VPOS>VDD) to the HOT-B PFET header 52 during standby mode to further reduce sub-threshold leakage. Also, a negative gate bias (VNEG) 60 (VNEG<GND) can be applied to the HOT-B PFET header in active mode to further boost active mode circuit performance.

Figure 5:
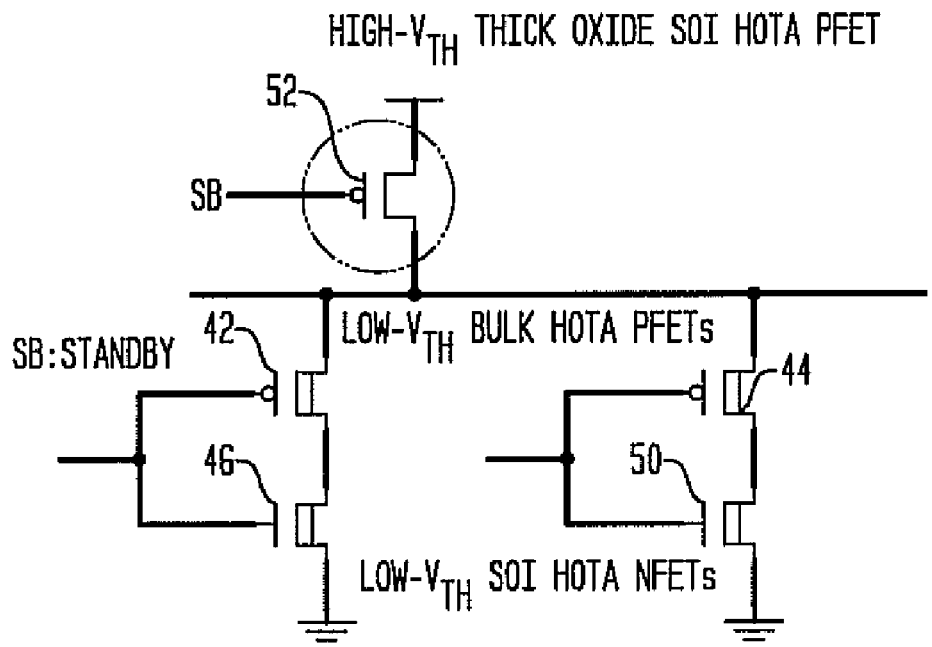
FIG. 5 shows a HOT-A high-VTH thick oxide bulk SOI PFET header designed in accordance with a third embodiment of the invention.
Figure 6:
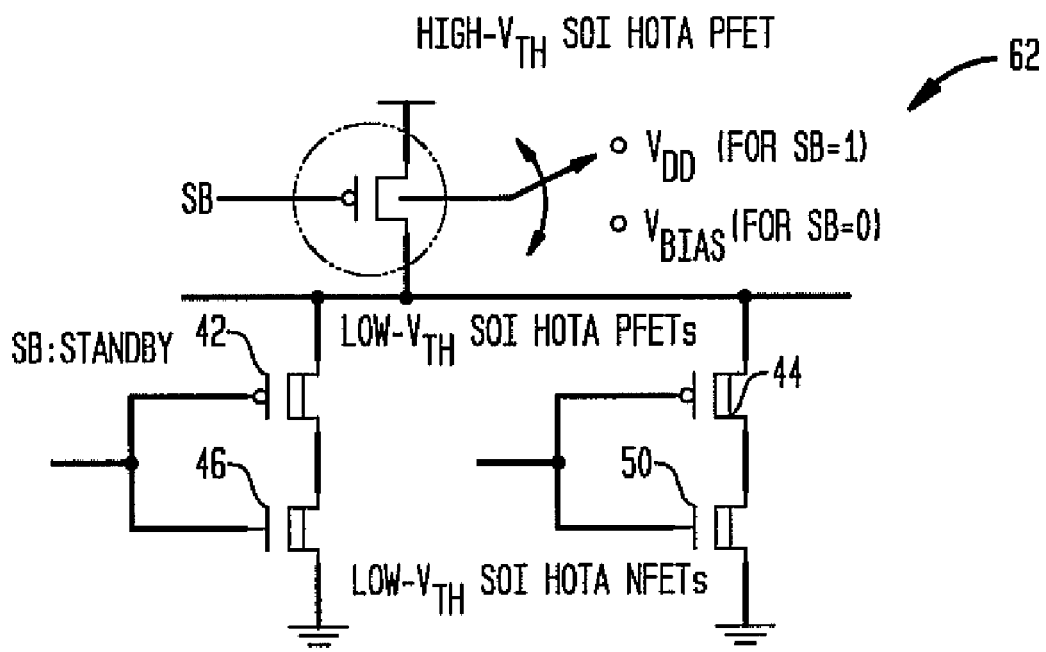
FIG. 6 shows a fourth embodiment of the invention, which comprises a HOT-A high-VTH thick oxide SOI PFET header with body bias.

Another embodiment of this invention in HOT-A is shown in FIG. 5, where the logic PFETs 42 and 44 in the circuit (along with the high-VTH thick oxide PFET header 52) are in SOI, and the NFETs 46 and 50 are in silicon epitaxial layer. This also bodes very well for the header performance compared with the basic MTCMOX scheme, because the PFET header, as shown in FIG. 6 at 62, can be individually body-biased in the active mode with a voltage lower than VDD to further boost the header PFET and circuit performance. As in the embodiment of FIG. 3, this scheme also significantly reduces gate and sub-threshold leakages because of the high-VTH thick oxide header PFET.

Figure 7:
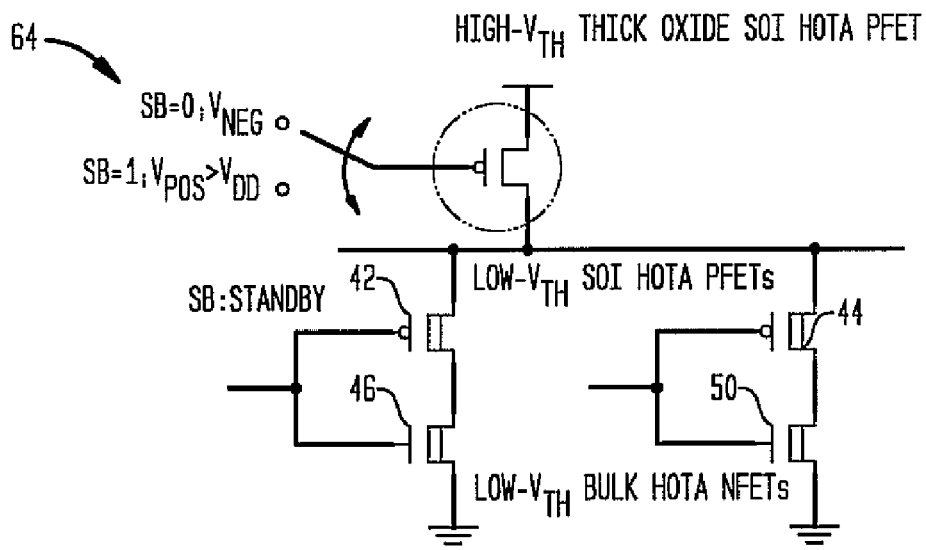
FIG. 7 illustrates a HOT-A high-VTH thick oxide SOI PFET header with special gate bias designed in accordance with a fifth embodiment of the invention.

As with the above-discussed embodiments, the scheme of FIG. 6 can be expanded, as shown in FIG. 7 at 64, by applying a positive gate bias VPOS (VPOS>VDD) during standby mode to further reduce standby leakage, and a negative gate bias VNEG (VNEG>GND) in active mode to further boost circuit performance to the HOT-A high VTH thick oxide SOI PFET header scheme.

While the above-discussed PFET header schemes are illustrated with static CMOS circuits, they can also be used with dynamic CMOS circuits and SRAMs to achieve high-performance with low leakage power.

Figure 8:
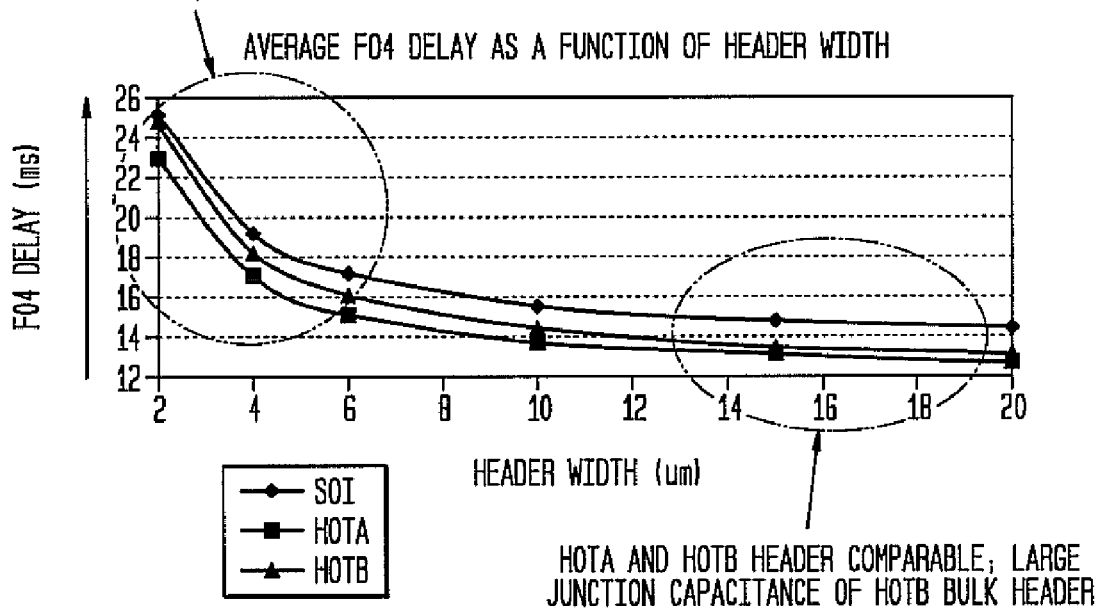
FIG. 8 is a graph that shows a comparison of HOT-A, HOT-B and conventional SOI headers for various header widths.

A comparison of HOT-A, HOT-B and conventional SOI headers in FIG. 8 clearly shows the performance advantage of the embodiments of this invention over the conventional SOI header. For small header widths, HOT-A performance is better than HOT-B. However, at larger header widths, HOT-A and HOT-B have comparable performance. The large junction capacitance of the bulk HOT-B header helps in overcoming the disadvantage of a lesser current drive with respect to the SOI HOT-A header.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A hybrid orientation technology digital CMOS circuit, comprising:
   a silicon substrate;
   first and second FETs, each of the FETs including a source region, a drain region and a gate region, the first FET including a silicon channel region connecting the source and drain regions of the first FET and in direct contact with the substrate, the second FET including a silicon channel region connecting the source and drain regions of the second FET, and wherein one of the FETs is a PFET and the other of the FETs is an NFET;
   an insulator region separating the second FET from the silicon substrate, wherein said second FET is a silicon-on-oxide layer; and
   a high-VTH thick oxide header PFET on the substrate and connected in series with the first and second FETs, said header PFET including a source, a drain a gate, and a silicon header channel region connecting the source and the drain of the PFET header to reduce the standby gate leakage of the PFET header.

2. A hybrid orientation technology CMOS circuit according to claim 1, wherein:
   the first FET is the PFET and the second FET is the NFET, and the first and second FETs form a hybrid orientation technology-B structure; and
   said header PFET is built up from and is in direct contact with the silicon substrate, and the header PFET is a bulk PFET.

3. A hybrid orientation technology CMOS circuit according to claim 1, further comprising:
   a further insulator region separating the header PFET from the silicon substrate, wherein the header PFET also is a silicon-on-oxide layer; and
   wherein the first FET is the NFET and the second FET is the PFET, and the first and second FETs form a hybrid orientation technology-A structure.

4. A hybrid orientation technology CMOS circuit according to claim 1, further comprising a biasing subcircuit to positively bias the gate of the header PFET during first selected times to further reduce sub-threshold leakage during the first selected times, and to negatively bias the PFET header at second selected times to further boost circuit performance during said selected times.

5. A hybrid orientation technology CMOS circuit according to claim 4, wherein:
the header PFET has a standby mode and an active mode;
the first selected times are when the PFET header is in the standby mode; and
the second selected times are when the PFET header is in the active mode.

6. A hybrid orientation technology CMOS circuit according to claim 3, further comprising:
a biasing subcircuit to bias a body of the header PFET in accordance with a defined procedure.

7. A hybrid orientation technology CMOS circuit according to claim 6, wherein:
the biasing subcircuit biases the body of the header PFET at predetermined times.

8. A hybrid orientation technology CMOS circuit according to claim 7, wherein:
the header PFET has an active mode; and
the biasing subcircuit biases the body of the header PFET when the header PFET is in the active mode, to further boost the header PFET and circuit performance.

9. A hybrid orientation technology CMOS circuit according to claim 1, wherein the first and second FETs are low-VTH FETs.

10. A hybrid orientation technology CMOS circuit according to claim 1, wherein the first of the FETs is the PFET and is located in series between the header PFET and the second of the FETs.

11. A hybrid orientation technology digital CMOS circuit, comprising:
a silicon substrate;
a PFET formed on the substrate, and including source, drain, gate and channel regions, said channel region connecting the source and drain regions of the PFET, wherein the PFET is in direct contact with the silicon substrate;
an NFET formed on the substrate, and including source, drain, gate and channel regions, the channel region of the NFET connecting the source and drain regions of the NFET;
an insulator region separating the NFET from the silicon substrate, wherein the NFET is a silicon-on-oxide layer, and the PFET and the NFET form a hybrid orientation technology-B structure; and
a high-VTH, thick oxide header PFET formed in the substrate and connected in series with the NFET and the PFET, said header PFET including a source, a drain, a gate and a header channel region connecting together the source and drain of the header PFET, wherein the header PFET is in direct contact with the silicon substrate to reduce the standby gate leakage of the header PFET.

12. A hybrid orientation technology digital circuit according to claim 11, further comprising:
a gate biasing subcircuit to positively bias the gate of the header PFET at first selected times to further reduce sub-threshold leakage during the first selected times, and to negatively bias the header PFET at second selected times to further boost circuit performance during said second selected times.

13. A hybrid orientation technology digital circuit according to claim 12, wherein:
the header PFET has a standby mode and an active mode;
the first selected times are when the header PFET is in the standby mode; and
the second selected times are when the header PFET is in the active mode.

14. A hybrid orientation technology digital CMOS circuit, comprising:
a silicon substrate;
a PFET formed on the substrate, and including source, drain, gate and channel regions, said channel region connecting the source and dram regions of the PFET;
an NFET formed on the substrate, and including source, drain, gate and channel regions, the channel region of the NFET connecting the source and drain regions of the NFET, and wherein the NFET is in direct contact with the silicon substrate;
an insulator region separating the PFET from the silicon substrate, wherein the PFET is a silicon-on-oxide layer, and the PFET and the NFET form a hybrid orientation technology-A structure;
a high-VTH, thick oxide header PFET formed on the substrate and connected in series with the NFET and the PFET, said header PFET including a source, a drain, a gate and a header channel region connecting together the source and drain of the header PFET, to reduce the standby gate leakage of the header PFET; and
another insulator region separating the header PFET from the silicon substrate, wherein the header PFET is also a silicon-on-oxide layer.

15. A hybrid orientation technology digital circuit according to claim 14, further comprising:
a gate biasing subcircuit to positively bias the gate of the header PFET at first selected times to further reduce sub-threshold leakage during the first selected times, and to negatively bias the header PFET at second selected times to further boost circuit performance during said second selected times.

16. A hybrid orientation technology digital circuit according to claim 15, further comprising:
a body biasing subcircuit to bias a body of the header PFET in accordance with a defined procedure.

17. A hybrid orientation technology digital circuit according to claim 16, wherein:
the header PFET has a standby mode and an active mode;
the first selected times are when the header PFET is in the standby mode;
the second selected times are when the header PFET is in the active mode; and the body biasing subcircuit to bias a body of the header PFET in accordance with a defined procedure.

18. A method of designing a hybrid orientation technology digital CMOS circuit, comprising:
providing a silicon substrate; forming first and second FETs, each of the FETs including a source region, a drain region and a gate region, the first FET including a silicon channel region connecting the source and drain regions of the first FET and in direct contact with the substrate, the second FET including a silicon channel region connecting the source and drain regions of the second FET, and wherein one of the FETs is a PFET and the other of the FETs is an NFET;
forming an insulator region separating the second FET from the silicon substrate, wherein said second FET is a silicon-on-oxide layer; and
forming a high-VTH thick oxide header PFET on the substrate and connected in series with the first and second FETs, said header PFET including a source, a drain a gate, and a silicon header channel region connecting the source and the drain of the PFET header to reduce the standby gate leakage of the PFET header.

19. A method of designing a hybrid orientation technology CMOS circuit according to claim 18 wherein:
  the first FET is the PFET and the second FET is the NFET, and the first and second FETs form a hybrid orientation technology-B structure; and
  said header PFET is built up from and is in direct contact with the silicon substrate, and the header PFET is a bulk PFET.

20. A method of designing a hybrid orientation technology CMOS circuit according to claim 18, further comprising the step of:
  forming a further insulator region separating the header PFET from the silicon substrate, wherein the header PFET also is a silicon-on-oxide layer, and
  wherein the first FET is the NFET and the second FET is the PGET, and the first and second FETs form a hybrid orientation technology-A structure.

21. A method of designing a hybrid orientation technology CMOS circuit according to claim 19, comprising the further step of providing a biasing subcircuit to positively bias the gate of the header PFET during first selected times to further reduce sub-threshold leakage during the first selected times, and to negatively bias the PFET header at second selected times to further boost circuit performance during said second selected times.

22. A method of designing a hybrid orientation technology CMOS circuit according to claim 21, wherein:
  the header PFET has a standby mode and an active mode;
  the first selected times are when the PFET header is in the standby mode; and
  the second selected times are when the PFET header is in the active mode.

23. A method of designing a hybrid orientation technology CMOS circuit according to claim 18, wherein:
  providing a biasing sub circuit to bias a body of the header PFET in accordance with a defined procedure.

24. A method of designing a hybrid orientation technology CMOS circuit according to claim 23, wherein:
  the biasing subcircuit biases the body of the header PFET at predetermined times.

25. A method of designing a hybrid orientation technology CMOS circuit according to claim 24, wherein:
  the header PFET has an active mode; and
  the biasing subcircuit biases the body of the header PFET when the header PFET is in the active mode, to farther boost the header PFET and circuit performance.

* * * * *